(12) United States Patent
Barwicz et al.

(10) Patent No.: US 10,895,682 B1
(45) Date of Patent: Jan. 19, 2021

(54) EFFICIENT PHOTONIC CIRCUITS FOR LIQUID-COOLED HIGH-DENSITY DATACENTERS

(71) Applicant: International Business Machines Corporation, Armonk, NY (US)

(72) Inventors: Tymon Barwicz, Yorktown Heights, NY (US); Douglas M. Gill, South Orange, NJ (US); William M. Green, Irvington, NY (US); Jason S. Orcutt, Katonah, NY (US); Jessie C. Rosenberg, Mount Vernon, NY (US); Eugen Schenfeld, South Brunswick, NJ (US); Chi Xiong, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/518,131

(22) Filed: Jul. 22, 2019

(51) Int. Cl.
   *G02B 6/12* (2006.01)
   *G02B 6/30* (2006.01)
   *H05K 7/20* (2006.01)
   *H01S 5/022* (2006.01)

(52) U.S. Cl.
   CPC ..... *G02B 6/12004* (2013.01); *G02B 6/12007* (2013.01); *G02B 6/30* (2013.01); *H05K 7/20163* (2013.01); *H01S 5/0224* (2013.01)

(58) Field of Classification Search
   None
   See application file for complete search history.

(56) References Cited

U.S. PATENT DOCUMENTS

| | | | | |
|---|---|---|---|---|
| 5,521,992 | A * | 5/1996 | Chun | G02B 6/1221 257/666 |
| 6,603,915 | B2 * | 8/2003 | Glebov | G02B 6/12004 385/129 |
| 6,768,826 | B2 * | 7/2004 | Ayadi | G02B 6/4202 385/14 |

(Continued)

OTHER PUBLICATIONS

U.S. Appl. No. 16/140,883, filed Sep. 25, 2018, IBM.

(Continued)

*Primary Examiner* — Rhonda S Peace
(74) *Attorney, Agent, or Firm* — Jeffrey S. LaBaw; Jack V. Musgrove

(57) ABSTRACT

Photonic circuits are disclosed having an efficient optical power distribution network. Laser chips (InP) having different wavelengths are flip-chip assembled near the center of a silicon photonic chip. Each InP die has multiple optical lanes, but a given die has only one wavelength. Waveguides formed in the photonic chip are optically connected to the lanes, and fan out to form multiple waveguide sets, where each waveguide set has one of the waveguides from each of the different wavelengths, i.e., one waveguide from each InP die. The waveguide network is optimized to minimize the number of crossings that any given waveguide may have, and no waveguide having a particular wavelength crosses another waveguide of the same wavelength. The unique arrangements of light sources and waveguides allows the use of a smaller number of more intense laser sources, particularly in applications such as performance-optimized datacenters where liquid cooling systems may be leveraged.

20 Claims, 4 Drawing Sheets

(56) References Cited

U.S. PATENT DOCUMENTS

| | | |
|---|---|---|
| 9,466,590 B1 | 10/2016 | Barwicz et al. |
| 9,543,736 B1 | 1/2017 | Barwicz et al. |
| 9,869,831 B2 | 1/2018 | Barwicz et al. |
| 10,097,271 B2 | 10/2018 | Doerr |
| 10,151,877 B2 | 12/2018 | Hayakawa |
| 10,175,422 B2 | 1/2019 | Dong et al. |
| 2018/0358778 A1 | 12/2018 | Barwicz et al. |
| 2019/0154932 A1 | 5/2019 | Shi et al. |
| 2019/0162902 A1 | 5/2019 | Barwicz et al. |
| 2020/0249405 A1* | 8/2020 | Novack .................. H01L 24/02 |

OTHER PUBLICATIONS

Barwicz, Tymon, et al., "Demonstration of Self-Aligned Flip-Chip Photonic Assembly with 1.1dB Loss and >120nm Bandwidth", Frontiers in Optics, Optical Society of America, paper FF5F.3 (2016).

Barwicz, Tymon, et al., "Integrated Metamaterial Interfaces for Self-Aligned Fiber-to-Chip Coupling in Volume Manufacturing," IEEE J. of Selected Topics in Quantum Electronics, v. 25, n.3, pp. 1-13 (2019).

\* cited by examiner

EFFICIENT PHOTONIC CIRCUITS FOR LIQUID-COOLED HIGH-DENSITY DATACENTERS

BACKGROUND OF THE INVENTION

Field of the Invention

The present invention generally relates to photonic circuits, and more particularly to the arrangement and distribution of light sources within photonic circuits.

Description of the Related Art

Traditional computing devices such as general-purpose computer systems are fabricated using electronic logic (digital) circuits, but there is a movement toward optical computing systems, i.e., systems that use light (photonics) to convey as well as process digital information. Key features of such systems are light sources and distribution networks that supply the optical power.

Early photonic systems used laser packages maintained separately from integrated circuit chips that provide the electronic interface. The laser package has a fiber pigtail whose end can be fusion spliced to a distribution line such as a single fiber of a multi-fiber trunk. A single laser package provides only one nominal optical wavelength; typical wavelengths are in the visible spectrum or near-infrared. These components are not only very expensive but are also bulky, making compact distribution impossible.

The next step in photonic sources was the miniaturization of these laser packages so they could be mounted directly onto a substrate such as a CMOS (complementary metal-oxide semiconductor) die proximate the terminals of an optical fiber array. These smaller packages still provide only one wavelength each, so several laser packages are needed for high-end multiplexing (e.g., wavelength-division multiplexing, or WDM).

Further strides in photonic circuits were made with the advent of silicon (Si) photonic chips and optically active chips. An Si photonic chip has waveguides formed therein, i.e., the silicon itself acts as an optical medium. Si photonic devices can be made using existing semiconductor fabrication techniques, and because silicon is already used as the substrate for most integrated circuits, it is easy to create hybrid devices in which the optical and electronic components are integrated onto a single integrated circuit. Optically active chips, i.e., photonic integrated circuits, use optically active materials such as indium phosphide (InP) which can lase at required wavelengths.

InP chips can be flip-chip assembled onto Si photonic chips. Flip chip is a method for interconnecting semiconductor devices using solder bumps that have been deposited onto the chip pads. This type of solder attachment is referred to as controlled collapse chip connection (C4). In the paper "Demonstration of Self-Aligned Flip-Chip Photonic Assembly with 1.1 dB Loss and >120 nm Bandwidth" by Tymon Barwicz et al., self-aligned, direct, flip-chip assembly of photonic dies is demonstrated. This approach is compatible with standard high-throughput microelectronic packaging facilities having typical (±10 µm) tool placement accuracy. The method relies on solder-induced self-alignment to achieve this accuracy. A secondary photonic die, such as an InP laser array, is picked and placed on a primary photonic die or wafer with a purposeful offset from its desired position. During solder reflow, the surface tension of melted solder pushes the secondary die into alignment with waveguides or other optical structures in the primary die. Lithographically defined mechanical structures (e.g., standoffs) stop the solder-induced movement, for three-dimensional, sub-micron alignment accuracy. This technique is thus used for both electrical and optical connectivity.

Silicon photonics offers great improvements for high-speed chip-to-chip and intra-datacenter optical links, i.e., 100+G (G=gigabits per second). FIG. 1 illustrates an exemplary application for a transceiver circuit 10. The various components of transceiver circuit 10 are all formed in or mounted on a single silicon photonics chip 12. Transceiver circuit 10 includes a plurality of optical sources 14, such as InP laser chips. Each InP chip 14 provides optical power at a specific wavelength ($\lambda_i$) to allow for WDM. For this example, there are four different wavelengths (N=4). These light sources feed an optical power distribution network 16 that spreads out each wavelength to multiple waveguides organized in sets, i.e., each set has one waveguide for each specified wavelength, or four waveguides to a set further to this example. Each split-out waveguide is an input to a respective optical modulator 18. Modulators 18 encode information, i.e., program instructions or operand data, from integrated electronic circuitry (not shown) into the optical signals. Modulators 18 may be any conventional optical modulator such as Mach-Zehnder modulators, electro-absorption modulators, or ring modulators. The outputs of a set of modulators (four wavelengths) provide inputs to a respective optical multiplexer 20 for that set. Multiplexer 20 may likewise be any conventional optical multiplexer such as ring-based (cascaded ring filters). The waveguide output of a given multiplexer 20 terminates at a fiber coupler 22 which is operatively connected to an optical fiber 24 leading to an off-chip structure, e.g., a similar transceiver on a different chip, or a fiber trunk having fiber switches and fiber patch cables (not shown). Transceiver circuit 10 can also include decoding circuitry (not shown) to receive optical signals similarly generated by another transceiver, with splitters and demultiplexers that break out the fiber inputs into separate waveguides leading to photodetectors.

SUMMARY OF THE INVENTION

The present invention in at least one embodiment is generally directed to an integrated optical power distribution network for a photonic chip comprising a photonic substrate having a plurality of cavities adapted to receive respective light sources, and a plurality of waveguides formed in a single optical layer of the photonic substrate, each said waveguide having a proximate end and a distal end, the distal ends of said waveguides being arranged in different sets each having multiple waveguides, and the proximate ends of the multiple waveguides in a given set terminating at different respective cavities, wherein at least some waveguides cross others within the single optical layer. The number of waveguide crossings for any given waveguide is preferably less than or equal to a topological minimum necessary to achieve distribution of the waveguides from the cavities to the waveguide sets. The cavities are preferably located in a central area of the photonic substrate having a boundary which is at least as far from a closest edge of the photonic substrate as a closest spacing between the cavities. The light sources can be laser chips each having a different wavelength, each laser chip being a unitary structure with multiple optical lanes such that the light outputs for a given laser chip all have the same wavelength, and the proximate end of a given waveguide is optically connected to a respective one of the light outputs, each waveguide set thereby having one and only one of the waveguides with each of the different wavelengths. The integrated optical power distribution network can be designed to minimize cross-talk from the intersecting waveguides by ensuring that no waveguide having a particular wavelength crosses another waveguide having that wavelength. The laser chips may be bonded to the silicon photonic chip using a distributed feedback laser array or an external cavity laser array. The unique arrangements of light sources and waveguides disclosed herein allows for optimum distribution efficiency and the use of a smaller number of more intense laser sources, particularly in applications such as performance-optimized datacenters where liquid cooling systems may be leveraged.

The above as well as additional objectives, features, and advantages in the various embodiments of the present invention will become apparent in the following detailed written description.

BRIEF DESCRIPTION OF THE DRAWINGS

The present invention may be better understood, and its numerous objects, features, and advantages of its various embodiments made apparent to those skilled in the art by referencing the accompanying drawings.

The use of the same reference symbols in different drawings indicates similar or identical items.

DESCRIPTION OF THE PREFERRED EMBODIMENT(S)

Figure 1:
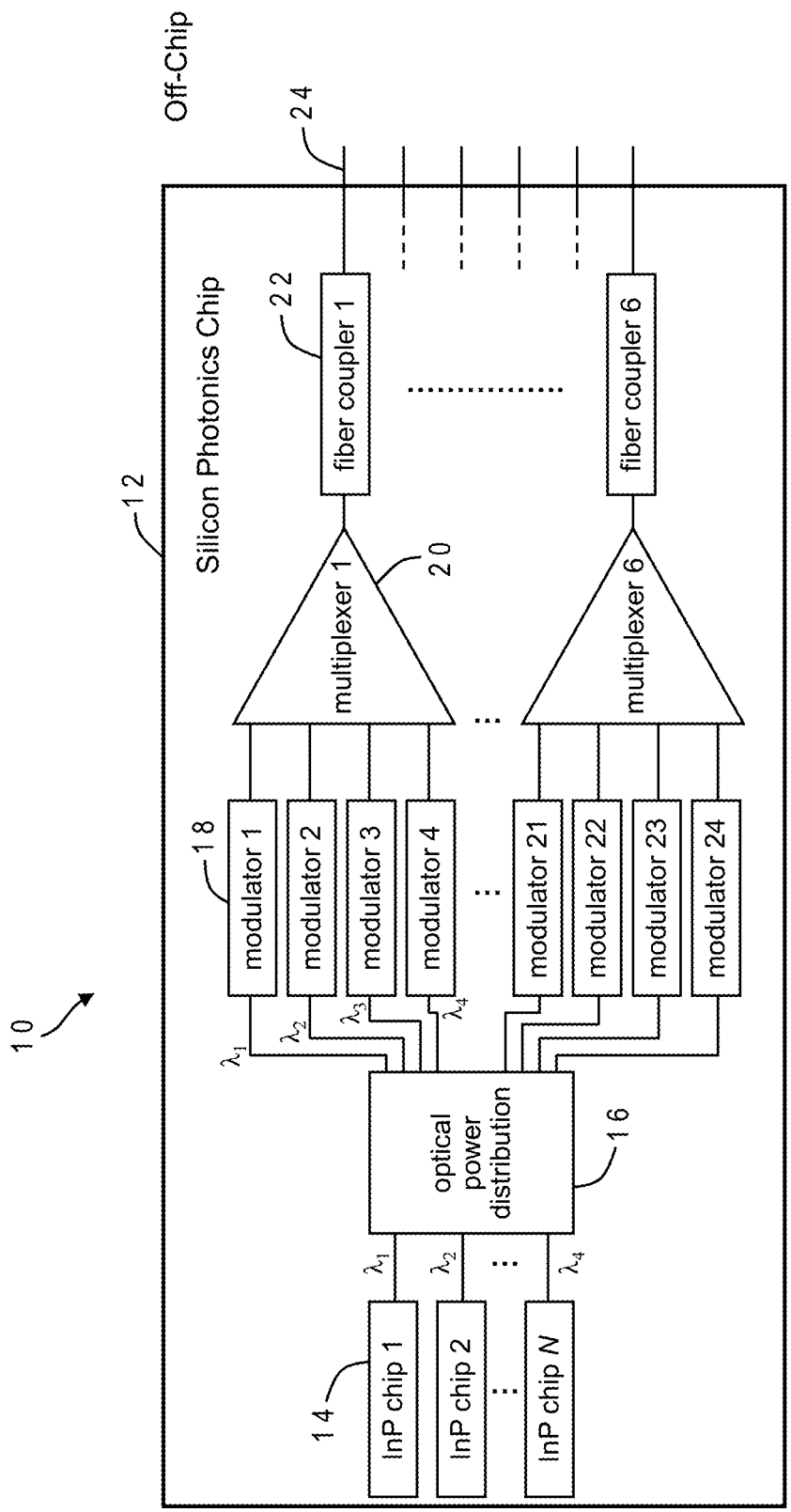
FIG. 1 is a schematic diagram of a conventional optical transceiver showing how an optical distribution network is used to convey optical power from multiple light sources (lasers) to multiplexed fiber optic outputs.

In a disaggregated datacenter, resource pools are physically separated. Resources such as processing, memory and data switches/routers need to be dynamically composed and connected to match changing needs of workloads. Optical connections are ideally made with minimal latency and replace wire-level simplicity that allows point-to-point direct flow of physically encoded signals with no processing, routing, buffering or regeneration of the physical signal in between. The technology to achieve such direct connections preferably uses all optical switches that can deflect an input to connect to an output regardless what the input stream of encoded data represents, its speed of signaling, or the number of different optical wavelengths associated with such input. The problem of connecting a large enough number of resources in a performance-optimized datacenter requires multiple levels of optical switch passes, even as each of the switches has a single stage with hundreds of ports that can be so connected between the input and output connected pairs. Thus with three passes of such switches, given each one has hundreds of ports, a large number of resource pools can be managed and connected. As light passes such switches, and is reflected from an input to an output, optical power losses are inevitable. Each such connection needs to have an optical power budget that provides the gap of operation at a specific signaling speed, e.g., 100 G for each wavelength, and the amount of optical power generated from the sources (lasers) and needed at the receivers (SiGe type of photo diodes with amplifiers) to achieve an acceptable signal-to-noise ratio of detection.

For the specific use outlined above, and other uses, as it regards the silicon photonics (SiPh) requirements, there are a certain number of spatial/fiber channels (such as a 12-fiber array packaging matching industry-standard 12-fiber core fibers), through which it is desired to achieve a certain aggregate communication bandwidth, multiplexed across a technically feasible number of wavelengths. A constraint is that the lasers must be packaged on the SiPh transceiver chip itself, not somewhere in a different module. Another constraint is maximizing the assembly yield for the whole SiPh chip. Also, given that the direct optical switches used have optical power insertion losses and may need as many as three passes through such, it is important to get a high enough optical power output to allow and end-to-end communication between resources in the disaggregated resource pools, without the need to regenerate and amplify the optical signals (which would add to cost and/or latency) while still achieving a reasonable bit error rate without the need for long latency error correction methods, such as forward error correction (FEC) which introduces a large latency due to it working on a long chain of bits in the communication link that need to be received and then observed to achieve error correction of the group. Hence the transmission of such large number of bits over the bandwidth of the link creates latency that cannot be tolerated especially as the state of workloads in the memory are separate and connected to processing resources as if they were locally and directly connected (for example, accelerators such as GPUs or AI-type).

The aspect of having enough optical power generated is not always possible to achieve with other Si photonics solutions today (such as bonding of III-V chiplets to the Si chip) and has to be carefully considered to assure an optimized and cost-effective solution. Moreover, as the number of optical sources increases and the wattage of those sources increases, cooling requirements can become unsustainable. InP lasing efficiency greatly improves at reduced temperatures, particularly 25° C. or below. Silicon photonics waveguide-based components are additionally very thermally dependent due to the large variation of the silicon refractive index with temperature.

In light of these sundry problems, it would be desirable to devise an improved approach for optical power distribution in a photonic circuit which could use fewer light sources to reduce cost and increase yield while still maintaining high optical power output for a large number of channels. It would be further advantageous if the optical power distribution were efficient enough to accommodate particularly dense photonic circuitry or alternatively allow operation at reduced temperatures to avoid the necessity of liquid cooling. These and other advantages are achieved in various embodiments of the present invention by providing multiple light sources (e.g., InP dies) bonded to a single photonic chip (e.g., silicon) in novel arrangements where optical lanes of the light sources are aligned with waveguides of the photonic chip that fan out in such a manner as to minimize optical insertion loss and optical crosstalk. Water cooling can be used if desired to meet the required link optical power budget over the thermal operating window of the system. Tradeoffs amongst the disclosed configurations are explicitly presented to allow the reader to find the best configuration for their specific application. These arrangements are in particular optimized to fulfill the specific requirements of disaggregated datacenters (high optical power, high optical channel count) while leveraging the generally superior thermal conditions specifically available in dense disaggregated datacenter racks.

Figure 2A:
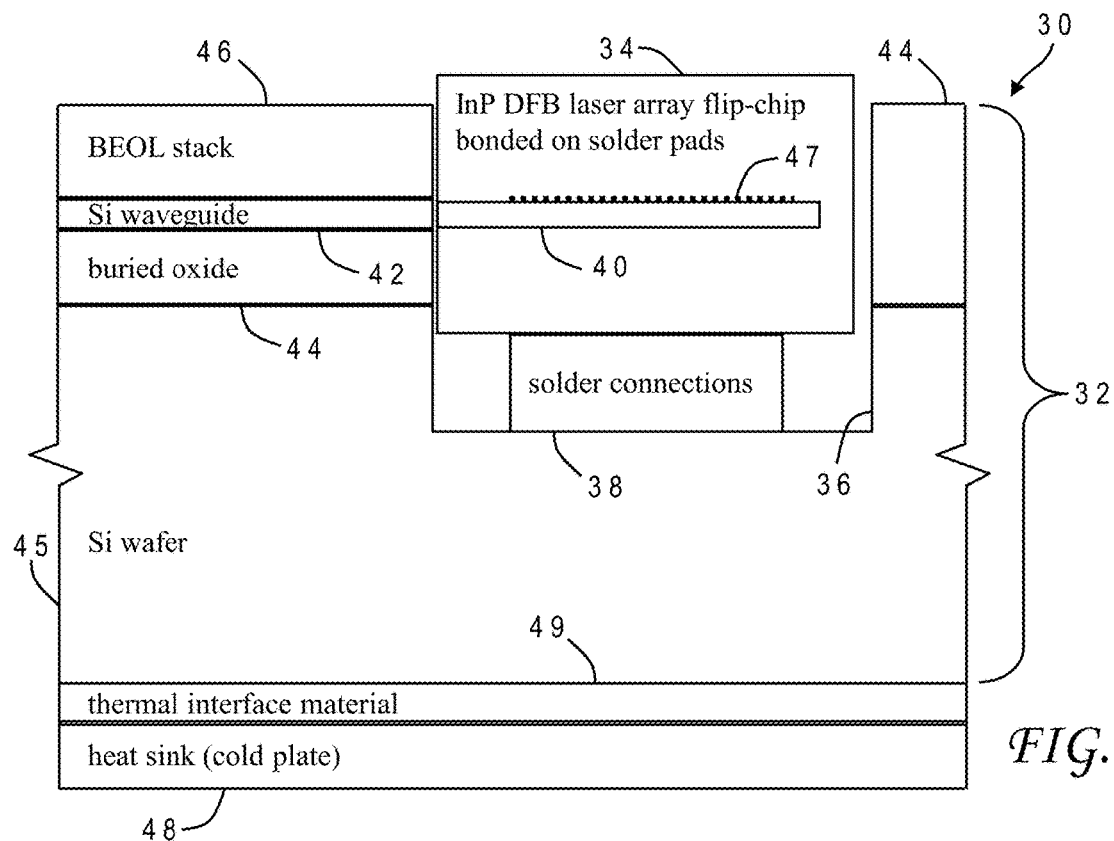
FIGS. 2A and 2B are cross-sectional views (not to scale) showing a light source chip (InP) flip-chip bonded to a photonic substrate (Si) with an optical lane of the light source chip aligned with a waveguide formed in the substrate using either a distributed feedback (DFB) laser integration option or external cavity laser (ECL) integration option in accordance with two embodiments of the present invention.

With reference now to the figures, and in particular with reference to FIG. 2A, there is depicted in cross-section one embodiment 30 of a photonic chip assembly constructed in accordance with the present invention. Photonic chip assembly 30 generally includes a photonic substrate 32 and a plurality of light sources 34 operatively mounted to photonic substrate 32. Photonic substrate 32 may be a silicon photonic chip and light sources 34 may be laser InP dies (only one InP die is shown in FIG. 2A). Other materials may be used for photonic substrate 32 and light sources 34 as technology allows. Features of photonic chip assembly 30 are not to scale in FIG. 2A so that they may be better perceived conceptually.

Each InP die 34 is located in a separate socket or cavity 36 formed in the top side of silicon photonic chip 32. Solder connections 38 at the bottom of cavity 36 bond InP die 34 to silicon photonic chip 32. Solder connections 38 are illustrated schematically as a whole, but those skilled in the art will understand that there are separate solder bumps formed along the lower surface of InP die 34 that respectively meld with solder bumps formed along the bottom surface of cavity 36 which are in contact with electrical pads that terminate wire structures (not shown) in silicon photonic chip 32 providing electrical voltage and ground rails to power the laser structures of InP die 34. In particular the InP dies may be bonded to the silicon photonic chip using the flip-chip bonding methodology described in the paper by Barwicz et al. referenced in the Background section above.

InP die 34 is fabricated as a unitary structure but has multiple optical lanes formed therein, each generally parallel and terminating along a common side of the die (other lane geometries could be used). In other words, a single InP die 34 has multiple laser outputs, or a laser array. The multiple lanes in a single die are formed using pattern lithography and etching. Only one lane 40 is visible in FIG. 2A. As part of the flip-chip bonding process, each lane 40 in InP die 34 is aligned with and abuts a respective waveguide 42 formed in silicon photonic chip 32. This alignment is in all three dimensions (x-, y- and z-directions) as well as parallel, i.e., the lane is colinear with its waveguide. Waveguide 42 may be sandwiched between other layers of silicon photonic chip 32. In this embodiment, the waveguide is silicon and is located between a buried oxide layer 44 and a back end-of-line (BEOL) stack layer 46. Buried oxide layer 44 is formed on the chip base, i.e., silicon wafer 45. BEOL stack layer 46 is the topmost layer in this embodiment. Layer 44 is on the other side of InP die 34 is constructed of the same composition as stack 44/45, except there is no silicon waveguide, i.e., it is generally a stack of oxides and BEOL films. Each of the layers of silicon photonic chip 32 extends further to the left and right in FIG. 2A as indicated by the jagged lines at those sides. As explained further below, each of the InP dies 34 (i.e., each of the cavities 36) is generally located in a central area of silicon photonic chip 32.

There are different options when implementing InP chips bonded to silicon photonic dies for wavelength assignment. The embodiment of FIG. 2A is directed to a distributed feedback (DFB) laser integration configuration. Further to this option, InP die 34 is a DFB laser array wherein each optical lane has a wavelength-selective reflector 47 formed thereon. Wavelength-selective reflector 47 may be a Bragg grating. All lanes in a given InP die have the same wavelength, i.e., the die is single $\lambda$. InP chips with multiple $\lambda$ are difficult to fabricate if those $\lambda$ extend beyond the typical gain spectra and so are not discussed here further, but the invention could still be implemented with such multiple $\lambda$ InP chips. Wavelengths may vary by designer preference and are generally conventional, in the range of near-infrared to visible spectrum. Different InP dies in the same photonic chip assembly 30 have different wavelengths, for downstream wavelength-division multiplexing (WDM). Waveguides 42 fan out to an optical power distribution network as described further below in conjunction with FIGS. 3 and 4.

For some applications such as performance-optimized datacenters having dense optical interconnections, it may be desirable (or necessary depending upon requirements) to provide thermal management to photonic chip assembly 30. Heat buildup is exacerbated by the use of multi-lane InP chips. Thermal management may take the form of a heat sink 48 applied to the bottom side of silicon photonic chip 32 via a thermal interface layer 49. Thermal interface material 49 is conventional and may for example be an elastomeric thermal interface material or a curable thermal gel. Heat sink 48 is any material with a very low heat capacity such as a metal, and in particular an aluminum block. The block may have heat dispersion fins extending into a channel that provides air circulation. Heat sink 48 may extend across the complete silicon wafer 45 or only a portion thereof proximate the InP dies. In those cases where thermal specifications require particularly low temperatures, heat sink 48 may be a cold plate. A cold plate is essentially a heat sink that is directly cooled via a circulating fluid, such as water that passes through or is otherwise in contact with the heat sink material; see U.S. Pat. No. 9,818,667 (which is hereby incorporated) for details regarding thermal interface materials, heat sinks, cold plates and cooling systems.

Figure 2B:
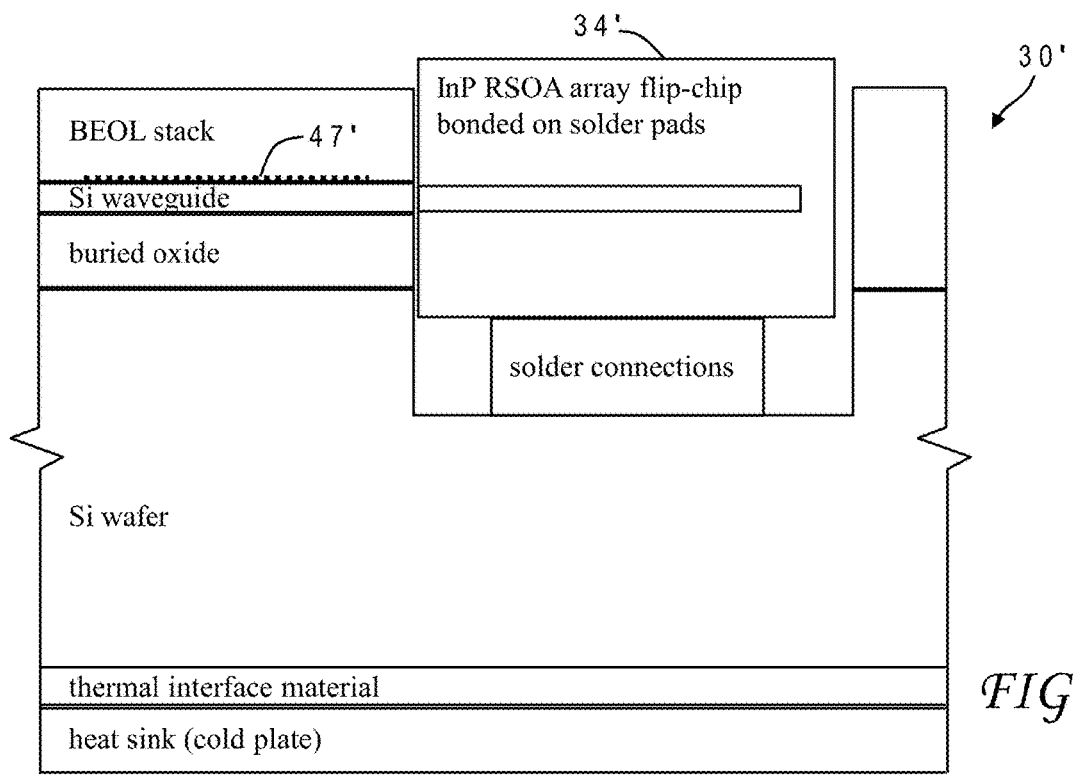

Another option for implementing InP chips on silicon photonic dies is an extended cavity laser (ECL) integration as seen in the alternative photonic chip assembly 30' of FIG. 2B. Photonic chip assembly 30' is generally identical to photonic chip assembly 30 of FIG. 2A except for the manner of wavelength selection. In photonic chip assembly 30', the InP die 34' is a reflective semiconductor optical amplifier (RSOA) array. Further to this option, a wavelength-selective reflector 47' is formed on the waveguide in the silicon substrate. As with the same result of FIG. 2A, all waveguides emanating from a single InP die 34' have the same $\lambda$, and the ECL configuration may provide any wavelength.

Figure 3:
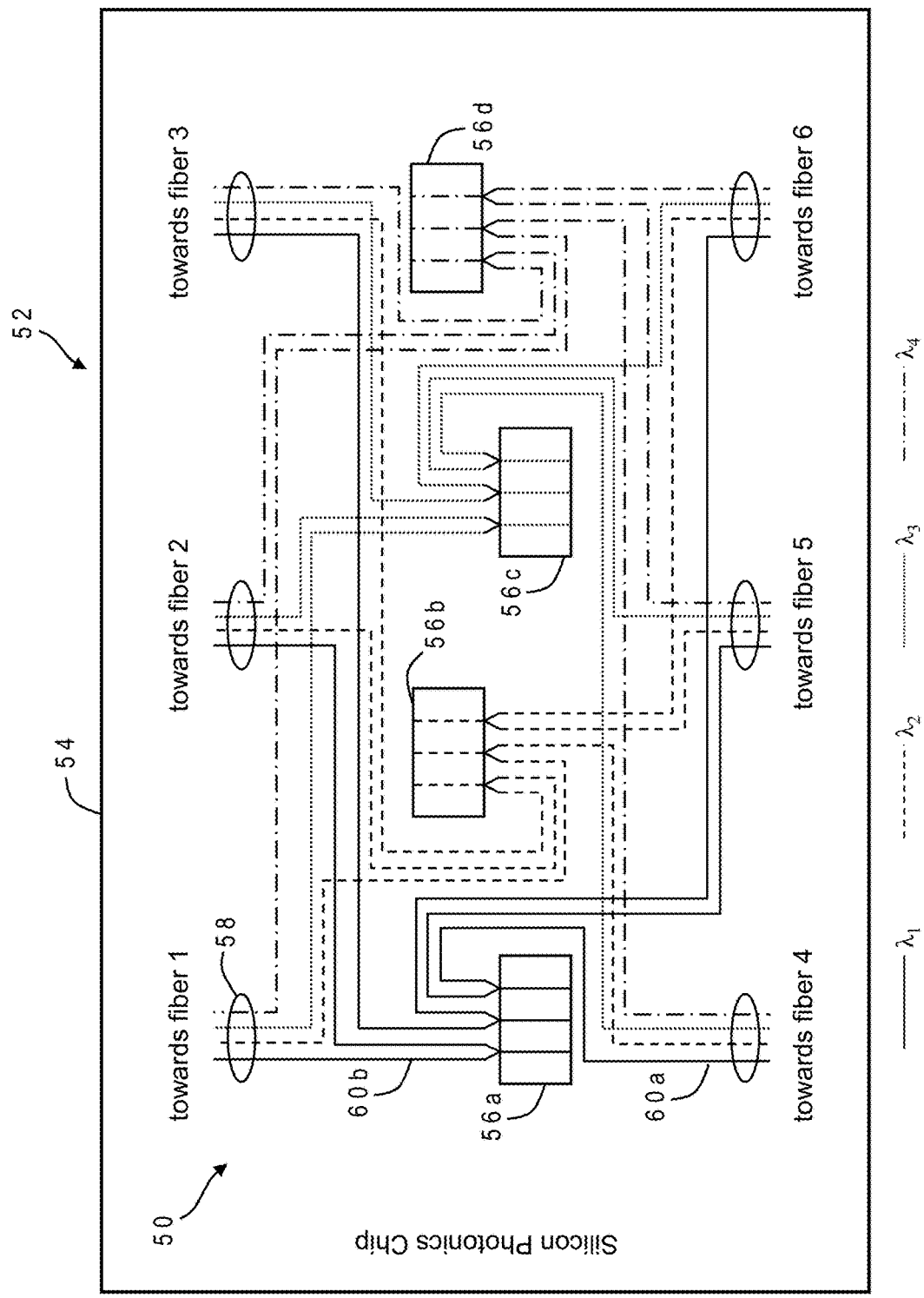
FIG. 3 is a schematic view of an integrated optical power distribution network for a silicon photonic chip in accordance with one embodiment of the present invention with flip-chip assembly of InP chips in a central area of an Si chip and splitting of each InP output into multiple lanes on-chip which are aligned with waveguides on the Si chip arranged for optimal routing.

Referring now to FIG. 3, there is depicted a schematic view of an integrated optical power distribution network 50 for a photonic chip assembly 52 in accordance with one embodiment of the present invention. Photonic chip assembly 52 includes a silicon photonic chip 54 with flip-chip assembly of four InP chips 56a, 56b, 56c, 56d (per FIGS. 2A and 2B) in a central area of silicon photonic chip 54. For this exemplary embodiment, each InP chip 56a, 56b, 56c, 56d has three optical lanes formed therein, and each lane is split out into two waveguides on silicon photonic chip 54. The splitting can be accomplished in a variety of ways known to those skilled in the art, such as adiabatic splitting, evanescent coupling, etc. Thus, there are a total of six waveguides emanating from a given InP chip. A given InP chip has a single wavelength, i.e., all three lanes are the same wavelength, but each chip is assigned a different wavelength for downstream WDM, so there are four different wavelengths $\lambda_1$, $\lambda_2$, $\lambda_3$, $\lambda_4$ as indicated by the particular form of the solid, dashed or dotted lines in FIG. 3 representing the waveguide channels forming integrated optical power distribution network 50. The term "integrated" as used here has the same meaning as with electronic integrated circuits, that is, all of the components of the integrated optical power distribution network are formed on a single photonic chip.

Inasmuch as there are six waveguides emanating from a single InP chip, the waveguides in optical power distribution network 50 from all of the InP chips can together fan out to form six different sets 58 of waveguides along a periphery of silicon photonic chip 54, where each set has one (and only one) waveguide of a particular wavelength, so each set has all four of the wavelengths arranged as four parallel adjacent waveguides. In other words, each waveguide has a first (proximate) end which is optically connected to one of the laser outputs and has a second (distal) end which fans out to other connections. Further to this example, three of the sets extend in a first direction toward one edge of silicon photonic die 54 (north direction toward a top edge in the perspective of FIG. 3) and the other three sets extend in a second direction toward the opposite edge of silicon photonic die 54 (south direction toward a bottom edge in the perspective of FIG. 3); alternative arrangements can be devised wherein one or more sets extend in other directions (e.g., east or west).

The paths of the twenty-four total waveguides are arranged for optimal routing, by keeping the number of crossings for any given waveguide at or below a predetermined maximum number (some of the waveguides have no crossings). Because the waveguides are all formed in the same layer of silicon photonic chip 54, the crossings represent an actual intersection of the optical media conveying the laser light. This intersection results in a small power loss, so minimizing the number of crossings per waveguide keeps total power loss down for that waveguide. The intersections can also introduce cross-talk, but this effect can be minimized by ensuring that no waveguide crosses another waveguide of the same wavelength. This latter feature can be implemented by nesting waveguides of a given wavelength such that there is a progression of the waveguide outputs for a given InP chip from an innermost path to an outermost path. For example, looking at the six waveguides emanating from InP chip 56a, the waveguide 60a extending toward fiber 4 may be considered an innermost path (which has zero crossings) and the waveguide 60b extending toward fiber 1 may be considered an outermost path (which also has zero crossings) with the other four waveguides nested between these two.

The maximum number of crossings per waveguide is preferably the topological minimum necessary to achieve the fan-out of the waveguides to each waveguide set; in other words, as a topological matter, the distribution of the paths in the same plane to the different sets requires that at least one path has this number of crossings. The topological minimum is a function of the number of waveguide sets and number of light sources. For the embodiment of FIG. 3, the maximum number of crossings per waveguide is six, i.e., every waveguide has six or fewer crossings. The optical loss due to laser power distribution in this case is at most 2 dB (assuming ⅓ of a decibel per crossing) from a streamlined budget, so laser power needs to be increased accordingly.

The paths of the waveguides shown in FIG. 3 follow a Cartesian frame of reference (Manhattan) so each bend in a waveguide is orthogonal but this traversal is only an artifact of traditional circuit design and is not limiting of the present invention, i.e., the waveguide paths could follow diagonal directions or even be curved. Those skilled in the art will further appreciate that FIG. 3 is a schematic view for the light sources and waveguides so actual waveguide lengths and chip shapes can vary.

Use of multiple lanes per InP chip and splitting of the waveguides increases the overall yield for the photonic chip assemblies because it allows fewer InP chips to be used to achieve the necessary optical power distribution. As noted above, there are tradeoffs amongst various configurations of the optical power distribution network that may affect specific applications. One such tradeoff is the number of lanes per InP chip versus splitting of the waveguides at the InP chip outputs. The embodiment of FIG. 3 uses three lanes per chip with splitting to result in six sets, but the same result could be achieved using six lanes per chip and no splitting. However, a six-lane InP chip is much more difficult to fabricate. On the other hand, a three-lane chip option (in which each lane is required to have twice the power output compared to a six-lane chip) presents challenges to heat management. The three-lane chip option may thus appeal more in a datacenter which already has a heat management infrastructure such as liquid cooling systems which can be applied to the photonic chip assembly using a cold plate. These systems can maintain a heat sink at or below 5° C. which is sufficient to keep multiple three-lane InP chips adequately cooled with each lane running at around 88 milliwatts.

As mentioned above, the InP chips are placed in a central area of the silicon photonic chip, that is, in separate cavities of the central area. This arrangement offers an opportunity to leverage higher cooling efficiency and lower-operating temperatures for more optimal chip operation in a way that has not been heretofore seen. The disclosed placement of InP chips in the middle of the silicon photonic chip is counterintuitive as conventional configurations (derived from air-cooled considerations) place the InP chip on the edge of the silicon photonic chip to limit heating of the Si chip by the InP chip. This geometry is not a concern with higher quality cooling that allows for novel configurations which provide greater optical power distribution efficiency. The central area of the silicon photonic chip may be defined in various ways. For example, it could be a rectangular area that is a geometric center of the chip but this level of precision it not necessary. Conversely, any area whose boundary comes to an edge of the silicon photonic chip cannot be considered central. For purposes here, the central area can be understood as an area whose boundary is at least as far from an edge of the silicon photonic chip as the closest spacing between InP chips (i.e., between cavities containing the InP chips).

Silicon photonic chip 54 may extend further than that shown in FIG. 3 as needed to accommodate other optical components forming a photonic circuit. The waveguide sets 58 can fan out further (without any additional crossings) to other optical connections or optical components such as modulators used in a transceiver circuit.

Figure 4:
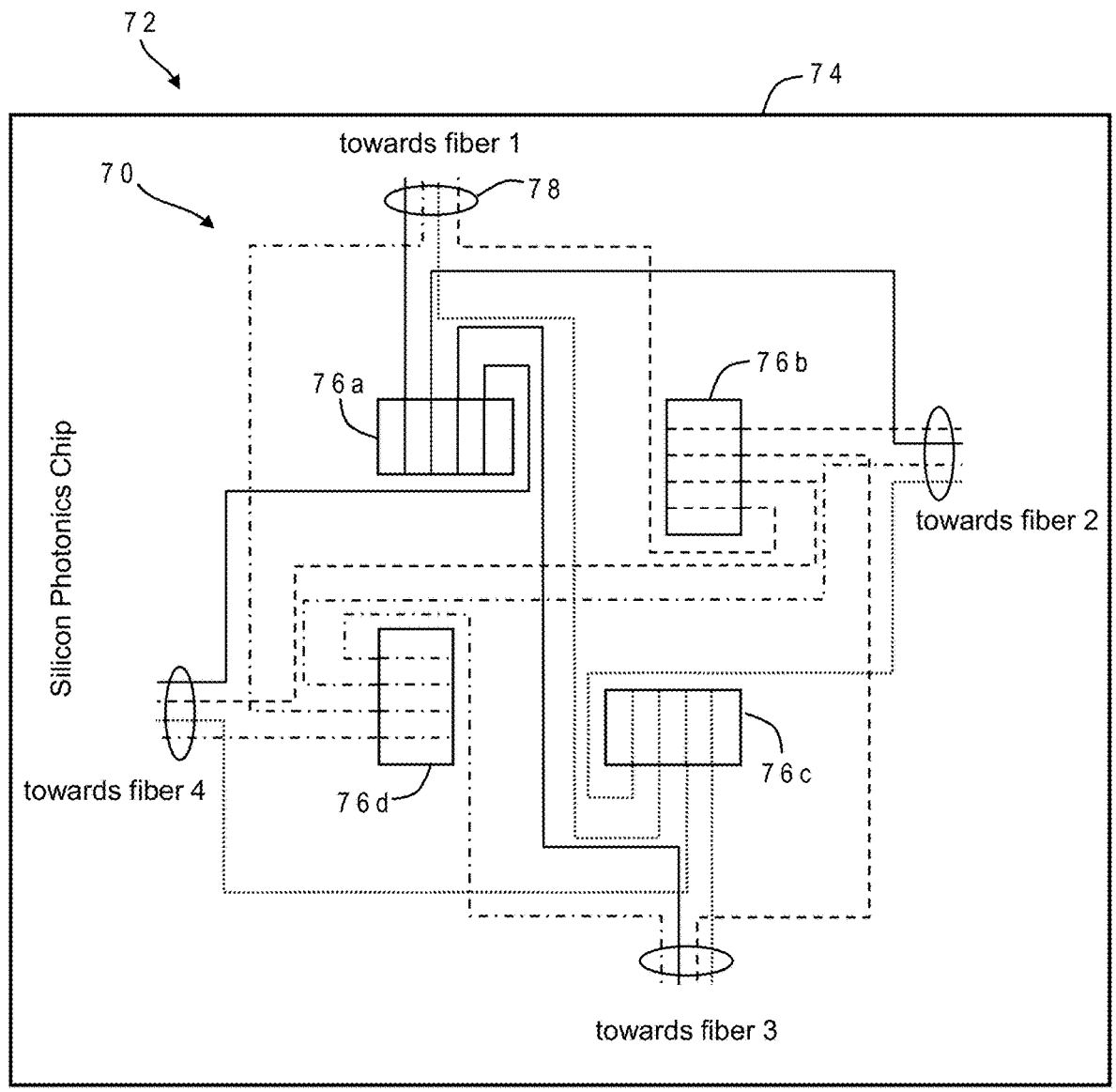
FIG. 4 is a schematic view of another optical distribution network for a silicon photonic chip in accordance with an alternative embodiment of the present invention.

Those skilled in the art will appreciate that there are a myriad of network configurations that can be implemented with different numbers of lanes per chip, different numbers of waveguide sets, etc. For purposes of illustration on this point, an alternative embodiment 70 of another integrated optical power distribution network for a photonic chip assembly 72 is presented in FIG. 4. Photonic chip assembly 72 includes a silicon photonic chip 74 with flip-chip assembly of four InP chips 76a, 76b, 76c, 76d in a central area of silicon photonic chip 74. In this embodiment, each InP chip 76a, 76b, 76c, 76d has four optical lanes formed therein (each chip is still single k), but there is no splitting of the waveguides, so the waveguide fan-out results in four waveguide sets 78. The four different wavelengths are similarly indicated by the particular form of the solid, dashed or dotted lines in FIG. 4 representing the waveguide channels forming integrated optical power distribution network 70. There are no more than three crossings for any given waveguide in this embodiment. The waveguide outputs of a given InP chip are again nested so no waveguide crosses another waveguide of the same wavelength. The four sets of waveguides extend in each of the four different Manhattan directions (north, east, south, west). There may be other minor design differences; for example, in FIG. 3 all of the waveguides in a given set (the four different wavelengths) are in same order or reverse order, but this is not the case in FIG. 4. The embodiments of FIGS. 3 and 4 are both four λ but the number of wavelengths could be more or less. Also, in both embodiments, at least some InP chips are not in the same row as other InP chips, i.e., the chips are arranged in a staggered manner. As with FIG. 3, silicon photonic chip 74 may extend further than that shown in FIG. 4, and the waveguide sets 78 can fan out further to other optical connections or optical components.

Those skilled in the art will appreciate that the use of words such as "top", "bottom", "left" and "right" in describing photonic chip assembly 30, silicon photonic chips 54, 74, and other features of the various embodiments of present the invention are used as relative terms and are not to be construed in a limiting sense, as they might be seen as different or opposite in nature when viewed from other perspectives.

The specific dimensions of the different features of an optical power distribution network according to the present invention may vary considerably depending upon application. The dimensions may also change with improvement in fabrication technology. The following dimensions are therefore considered exemplary and approximate. The silicon photonic chip could be from 1×1 mm to 100×100 mm, preferably from 3×3 mm to 20×20 mm, and most preferably 10×10 mm. The InP chips could be from 0.075×0.075 mm to 2×2 mm, preferably from 0.1×0.1 mm to 0.7×0.7 mm, and most preferably 0.3×0.3 mm. InP chip placement should be seen as relative to the silicon chip size. There is no strict minimum spacing between InP chips but an InP-to-InP minimum spacing of 30 μm allows enough space for the waveguides in between. A similar spacing to chip edge could also be considered.

The present invention thereby combines intelligent packaging and arrangement of light sources and photonic structures to allow the use of considerably fewer laser sources (thus saving cost) yet operate at a higher optical power output per laser, particularly when liquid cooling systems are available. Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. An integrated optical power distribution network for a photonic chip comprising:
   a photonic substrate having a plurality of cavities adapted to receive respective light sources; and
   a plurality of waveguides formed in a single optical layer of said photonic substrate, each said waveguide having a proximate end and a distal end, the distal ends of said waveguides being arranged in different sets each set having multiple waveguides, and the proximate ends of the multiple waveguides in a given set terminating at different respective cavities, wherein at least some of said waveguides cross other ones of said waveguides within the single optical layer and a number of waveguide crossings for any given waveguide is less than or equal to a predetermined number.

2. The integrated optical power distribution network of claim 1 wherein the predetermined number is a topological minimum necessary to achieve distribution of said waveguides from the cavities to the waveguide sets.

3. The integrated optical power distribution network of claim 1 wherein the cavities are located in a central area of said photonic substrate having a boundary which is at least as far from a closest edge of said photonic substrate as a closest spacing between the cavities.

4. The integrated optical power distribution network of claim 1 wherein at least a first pair of the cavities define a first row of said photonic substrate and at least a second pair of the cavities define a second row of said photonic substrate different from the first row.

5. The integrated optical power distribution network of claim 1 wherein at least a first one of the waveguide sets extends toward a first edge of said photonic substrate and at least a second one of the waveguide sets extends toward a second edge of said photonic substrate.

6. The integrated optical power distribution network of claim 1 further comprising a plurality of light sources each having a different wavelength operatively bonded to said photonic substrate in respective cavities, each said light source being a unitary structure with multiple light outputs such that the light outputs for a given one of said light sources have a same one of the different wavelengths, wherein the proximate end of a given waveguide is optically connected to a respective one of the light outputs, each waveguide set thereby having one and only one of the waveguides of each of the different wavelengths.

7. The integrated optical power distribution network of claim 6 wherein no waveguide having a particular wavelength crosses another waveguide having the particular wavelength.

8. The integrated optical power distribution network of claim 6 wherein the light sources are bonded to said photonic substrate as a distributed feedback laser array wherein the multiple light outputs constitute separate optical lanes each having a wavelength-selective reflector formed thereon.

9. The integrated optical power distribution network of claim 6 wherein the light sources are bonded to said photonic substrate as an external cavity laser array wherein the waveguides emanating from a given light source each have a wavelength-selective reflector formed at the proximate ends thereof.

10. A photonic chip assembly comprising:
a silicon photonic chip having a plurality of waveguides; and
a plurality of light source chips each having a different wavelength operatively bonded to said silicon photonic chip in a central area of said silicon photonic chip, each said light source chip being a unitary structure with multiple light outputs such that the light outputs for a given one of said light source chips have a same one of the wavelengths, each said light output being optically connected to a respective one of the waveguides.

11. The photonic chip assembly of claim 10 wherein:
the waveguides are formed in a single optical layer of said silicon photonic chip;
each waveguide has a proximate end and a distal end, the distal ends of said waveguides being arranged in different sets each set having multiple waveguides, and the proximate ends of the multiple waveguides in a given set terminating at respective light outputs of different light source chips such that each waveguide set has one and only one of the waveguides of each of the different wavelengths;
at least some of the waveguides cross other ones of the waveguides within the single optical layer; and
a number of waveguide crossings for any given waveguide is less than or equal to a predetermined number.

12. The photonic chip assembly of claim 11 wherein at least a first one of the waveguide sets extends toward a first edge of said photonic substrate and at least a second one of the waveguide sets extends toward a second edge of said silicon photonic chip.

13. The photonic chip assembly of claim 11 wherein the predetermined number is a topological minimum necessary to achieve distribution of the waveguides from the light source chips to the waveguide sets.

14. The photonic chip assembly of claim 13 wherein no waveguide having a particular wavelength crosses another waveguide having the particular wavelength.

15. The photonic chip assembly of claim 10 wherein the central area has a boundary which is at least as far from a closest edge of said silicon photonic chip as a closest spacing between the light source chips.

16. The photonic chip assembly of claim 10 wherein at least a first pair of the light source chips define a first row of said silicon photonic chip and at least a second pair of the light source chips define a second row of said silicon photonic chip different from the first row.

17. A photonic circuit comprising:
a silicon photonic chip having a plurality of cavities located in a central area along a top side of said silicon photonic chip;
a plurality of laser chips each having a different wavelength operatively bonded to said silicon photonic chip in respective cavities, each said laser chip being a unitary structure with multiple output lanes such that the output lanes for a given one of said laser chips have a same one of the wavelengths;
a plurality of optical components formed in said silicon photonic chip;
an integrated optical distribution network selectively providing optical power from said laser chips to said optical components, said integrated optical distribution network including a plurality of waveguides formed in a single optical layer of said silicon photonic chip, each waveguide having a proximate end and a distal end, the distal ends of the waveguides leading to said optical components and being arranged in different sets each set having multiple waveguides, and the proximate ends of the multiple waveguides in a given set terminating at respective output lanes of different laser chips such that each waveguide set has one and only one of the waveguides of each of the different wavelengths, wherein at least some of the waveguides cross other ones of the waveguides within the single optical layer, a number of waveguide crossings for any given waveguide is less than or equal to a topological minimum necessary to achieve distribution of the waveguides from the laser chips to the waveguide sets, and no waveguide having a particular wavelength crosses another waveguide having the particular wavelength; and
a heat sink applied to a bottom side of said silicon photonic chip.

18. The photonic circuit of claim 17 wherein each output lane has at least 88 milliwatts of power and said heat sink maintains a temperature at or below 5° C.

19. The photonic circuit of claim 17 wherein there are at least four laser chips and at least six waveguide sets, and optical loss in a given waveguide due to waveguide crossings is no greater than 2 decibels.

20. The photonic circuit of claim 17 wherein the photonic circuit is an optical transceiver, and said optical components include a plurality of optical modulators which feed one or more optical multiplexers.

* * * * *